(12) United States Patent
Lin et al.

(10) Patent No.: US 6,501,651 B2
(45) Date of Patent: Dec. 31, 2002

(54) HEAT SINK CAPABLE OF HAVING A FAN MOUNTED ASLANT TO THE LATERAL SIDE THEREOF

(75) Inventors: Bo-Yao Lin, Taipei (TW); Iris Huang, Taipei (TW); Michael Sun, Taipei (TW)

(73) Assignee: Acer, Inc. (TW)

( * ) Notice: Subject to any disclaimer, the term of this patent is extended or adjusted under 35 U.S.C. 154(b) by 6 days.

(21) Appl. No.: 09/760,944

(22) Filed: Jan. 15, 2001

(65) Prior Publication Data

US 2002/0003690 A1 Jan. 10, 2002

(30) Foreign Application Priority Data

Jul. 6, 2000 (TW) ........................................ 089113711 A

(51) Int. Cl.[7] .................................................. H05K 7/20
(52) U.S. Cl. ........................ 361/697; 361/687; 361/695; 257/719; 165/121
(58) Field of Search ................................ 361/687, 690, 361/692, 695, 704, 707, 715, 717–720, 722; 165/80.2, 80.3, 80.6, 121, 103.33, 165, 185; 174/16.1, 16.3; 257/706–727; 29/809.03, 592.1, 509

(56) References Cited

U.S. PATENT DOCUMENTS

| | | | |
|---|---|---|---|
| 5,353,863 A | * 10/1994 | Yu et al. ..................... | 165/80.3 |
| 5,440,450 A | 8/1995 | Lau et al. | |
| 5,491,610 A | * 2/1996 | Mok et al. .................... | 361/695 |
| 5,563,768 A | * 10/1996 | Perdue ......................... | 361/695 |
| 5,810,072 A | * 9/1998 | Rees et al. ................. | 165/80.3 |
| 6,094,346 A | * 7/2000 | Schweers et al. ............ | 361/695 |
| 6,269,002 B1 | * 7/2001 | Azar ........................... | 361/703 |

FOREIGN PATENT DOCUMENTS

| | | | | |
|---|---|---|---|---|
| JP | 407014954 | * | 1/1995 | ......... H01L/23/467 |
| JP | 409307034 A | * | 11/1997 | ........... H01L/23/40 |

* cited by examiner

Primary Examiner—Darren Schuberg
Assistant Examiner—Michael Datskovsky
(74) Attorney, Agent, or Firm—Knobbe, Martens, Olson & Bear, LLP

(57) ABSTRACT

A heat dissipation system for use with a computer chip includes a heat sink with a fan mounted aslant to the lateral side thereof. The heat sink includes a base having a first surface and a second surface. The computer chip is positioned in contact with the first surface. A heat dissipation unit is mounted on the second surface of the base. The heat dissipation unit includes a plurality of heat dissipation fins. An air-conducting device has a shape of an inverted U and is used to cover the heat dissipation unit. A fan is mounted aslant to a lateral side of the heat dissipation unit. The heat dissipation unit includes a plurality of rectangular dissipation fins. The fins are mutually parallel and are collocated above the base. The heat dissipation unit includes a predetermined number of heat dissipation fins having a common inclination to form an accommodating area on the lateral side of the heat dissipation unit. The fan is mounted aslant to the lateral side of the heat dissipation unit in the accommodating area.

20 Claims, 7 Drawing Sheets

HEAT SINK CAPABLE OF HAVING A FAN MOUNTED ASLANT TO THE LATERAL SIDE THEREOF

REFERENCE TO RELATED APPLICATION

The present application claims priority from Taiwan Application No. 089113711, entitled "Heat Sink Capable of Having a Fan Mounted Aslant to the Lateral Side Thereof," filed on Jul. 6, 2000.

BACKGROUND OF THE INVENTION

1. Field of the Invention

This invention relates to a heat sink for a computer chip, such as a Central Processing Unit (CPU) chip, and more particularly to a heat sink where a fan is mounted aslant to the lateral side thereof.

2. Description of the Related Art

As the function and complexity of computer chips have increased recently, the heat generated by computer chips has also increased. Additionally, the heat dissipation space of computer chips has become smaller and smaller since the information products emphasize small sizes and high clock rates. Therefore, how to effectively dissipate the heat in a limited space to maintain the performance of the computer chips becomes an important issue.

FIG. 1 is a schematic diagram of a prior art heat sink 10 mounted on a CPU chip 12. The heat sink 10 comprises a base 20, a heat dissipation unit 22 and a fan 24. The heat dissipation unit 22, having a plurality of heat dissipation fins 23, is mounted on the base 20. The fan 24 is mounted on the heat dissipation unit 22. In an exemplary computer server, the total height H of a housing 14 above a motherboard 16 is only 44.86 mm. Thus, after positioning a CPU slot 18 and the CPU chip 12 on the motherboard 16, only a height h of 27 mm is available for mounting the heat sink 10. As shown in FIG. 1, the fan 24 is so close to the upper cover of the housing 14 that the air entry area 26 is too small and the space for heat dissipation is limited. Therefore, the quantity of the air that can enter the fan 24 is quite small or close to zero. The low air flow causes the fan 24 to run idle, and no air is swept into the heat dissipation unit 22. Thus, the air from the fan 24 can not take the heat generated by the CPU 12 chip away, and the fan 24 can not effectively dissipate the heat from the CPU chip 12.

In addition, since the fan 24 is mounted on the heat dissipation unit 22, the location of the fan axis will cause the central area of the heat dissipation unit 22 to have little or no air flow or to have turbulent air flow. These phenomena cause the temperature in the central area of the heat dissipation unit 22 to be quite high. Since the CPU chip 12 is located under the heat dissipation unit 22, the effect of heat dissipation is greatly reduced.

SUMMARY OF THE INVENTION

One aspect of the present invention is to provide a heat sink where a fan is mounted aslant to the lateral side of the heat sink. The heat sink of the present invention not only enlarges the air entry area of the fan, but also can effectively sweep the air into the central area of a heat dissipation unit to achieve an improved heat dissipation effect.

The foregoing is a brief description of some deficiencies in the prior art and advantages of this invention. Other features, advantages and embodiments of the invention will be apparent to those skilled in the art from the following description, accompanying drawings and appended claims.

BRIEF DESCRIPTION OF DRAWINGS

The following detailed description, given by way of examples and not intended to limit the invention to the embodiments described herein, will be best understood in conjunction with the accompanying drawings, in which.

DETAILED DESCRIPTION OF THE INVENTION

Figure 1:
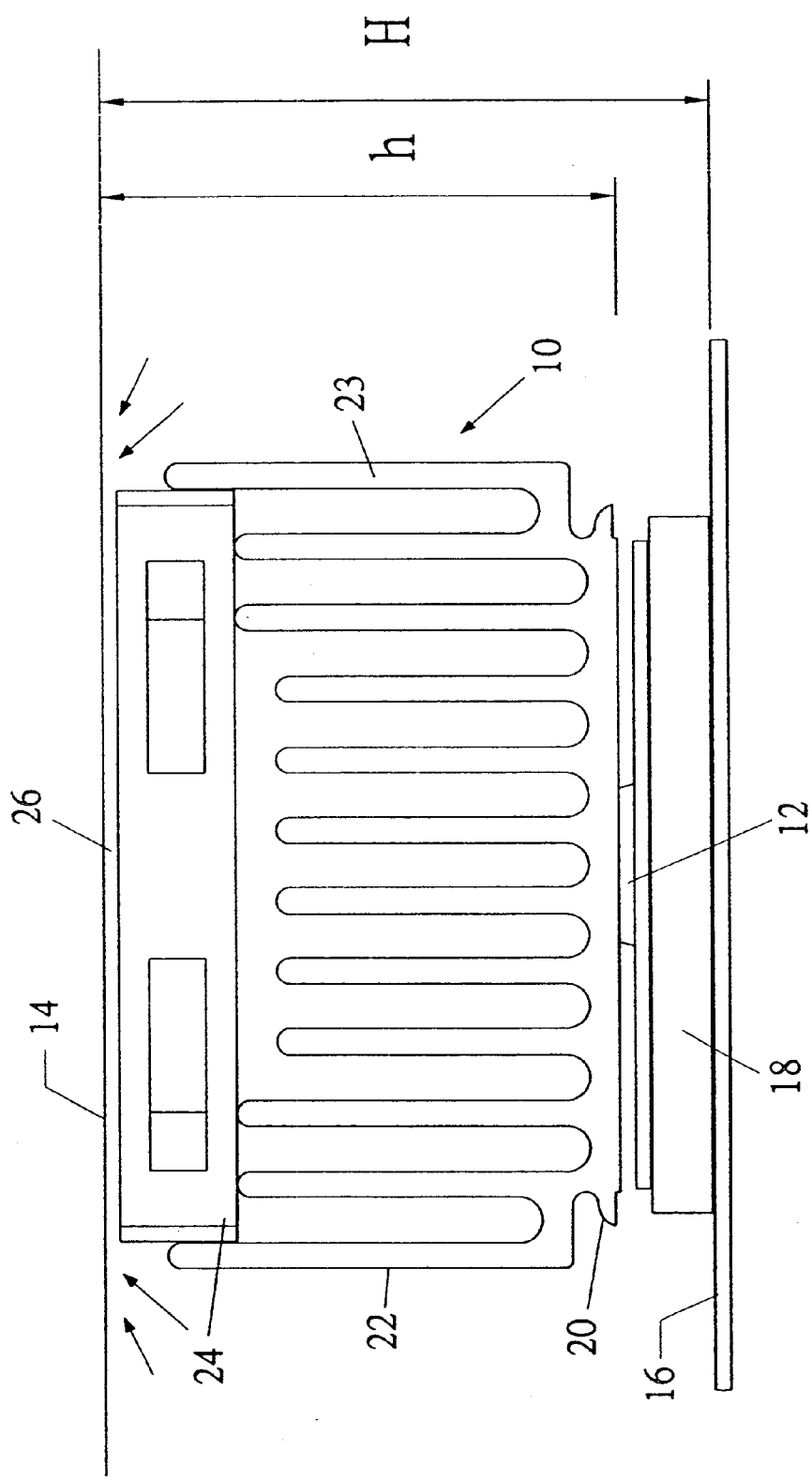
FIG. 1 is a schematic diagram of a prior art heat sink.
Figure 2:
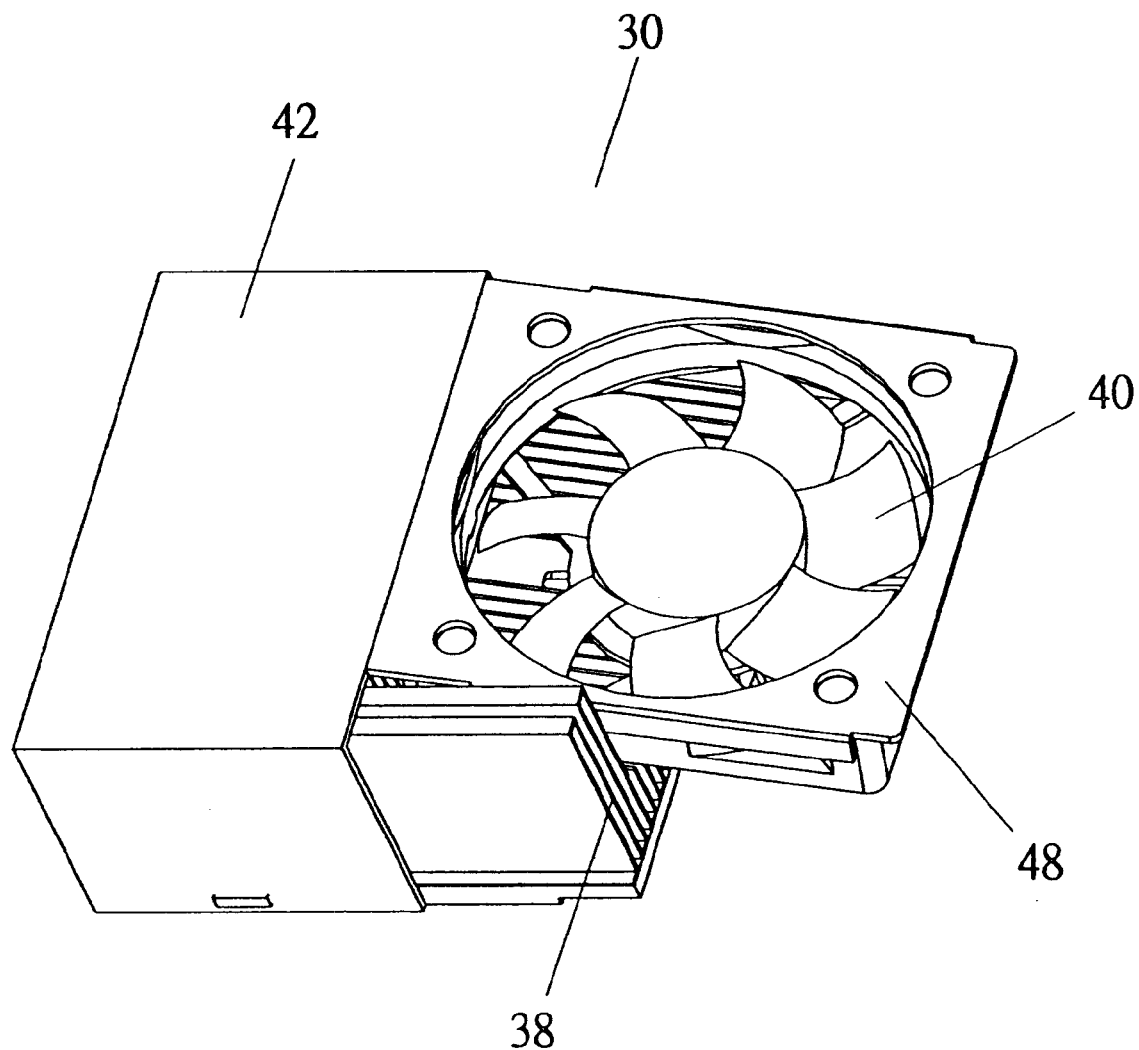
FIG. 2 is a schematic diagram of the first embodiment of a heat sink according to this invention.
Figure 2B:
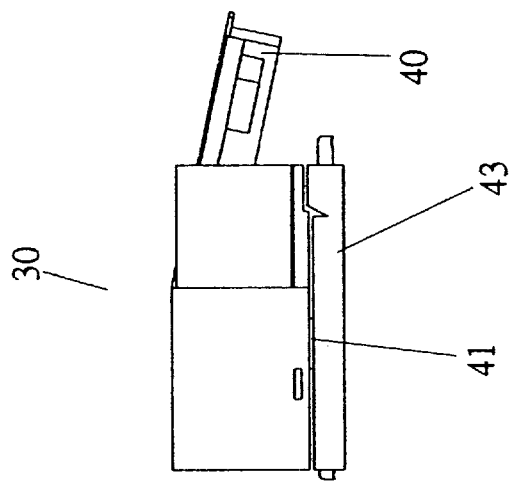
FIG. 2b is a side elevational diagram of the heat sink of FIG. 2 mounted on a CPU chip.
Figure 2A:
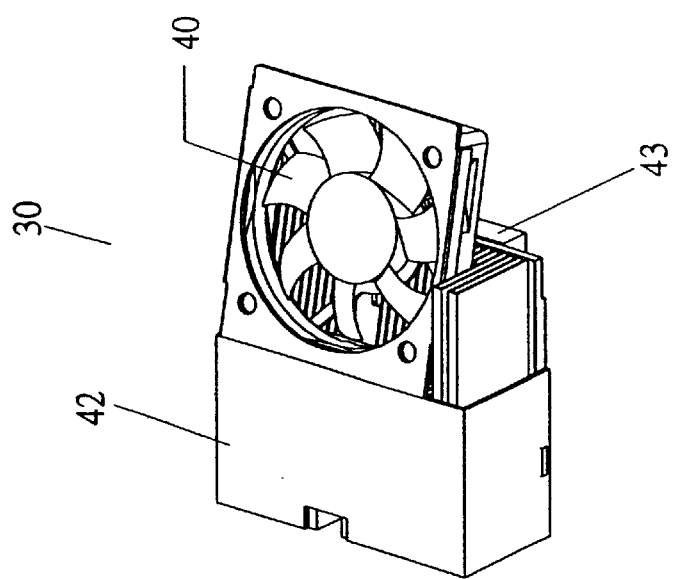
FIG. 2a is a perspective view of the heat sink of FIG. 2 mounted on a motherboard.

A first embodiment of the present invention is described below in connection with FIGS. 2, 2a, 2b and 3. FIG. 2 is a schematic diagram of the first embodiment of a heat sink 30 according to the present invention. FIG. 2a is a schematic diagram of the heat sink 30 of FIG. 2 mounted on a CPU chip 41 on a motherboard 43. FIG. 2b is a side elevational diagram of the heat sink 30 mounted on the CPU chip 41 on the motherboard 43, which shows the CPU chip 41 between the motherboard 43 and the heat sink 30.

Figure 3:
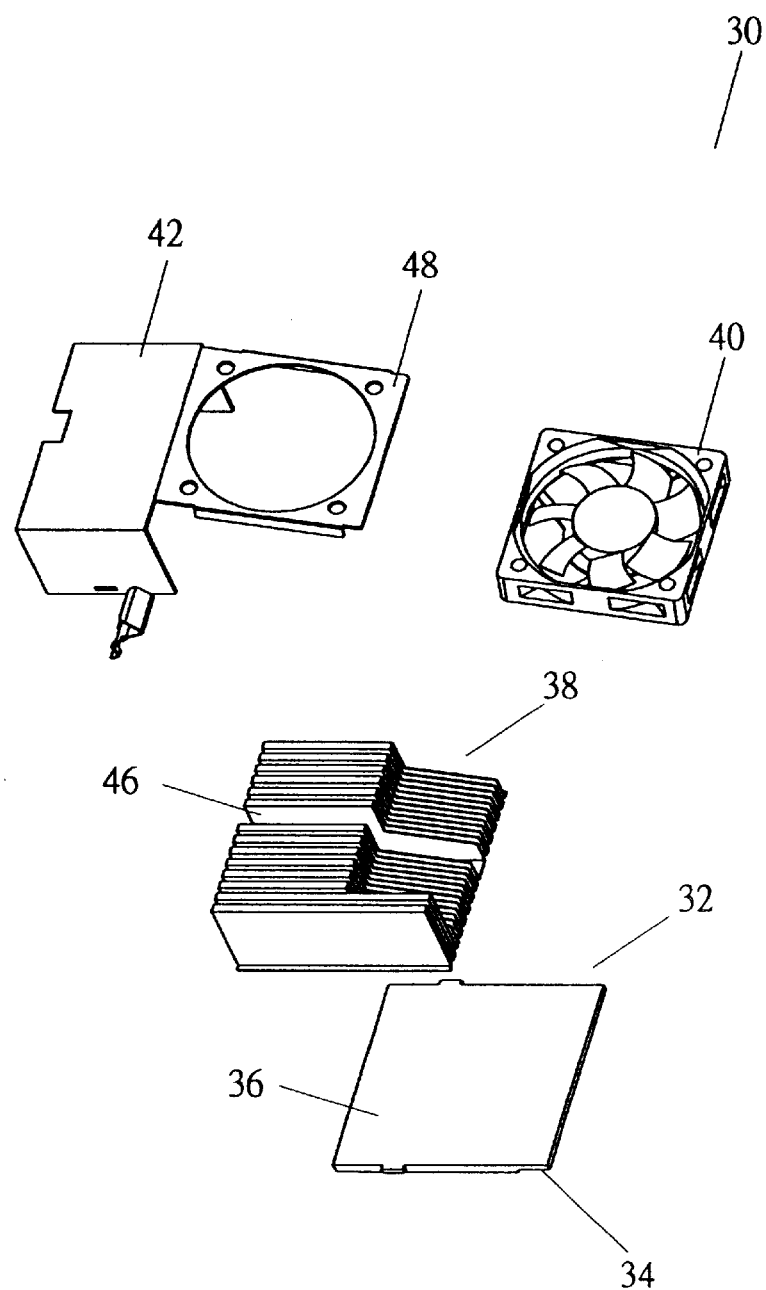
FIG. 3 is an exploded view of the elements of the heat sink in FIG. 2.

FIG. 3 illustrates an exploded view of the heat sink 30 in FIG. 2. The heat sink 30 comprises a base 32, a heat dissipation unit 38, a fan 40, an air-conducting device 42, and a fan positioner 48. The base 32 comprises a first surface 34 and a second surface 36. The computer chip, such as the CPU chip 41 (see FIG. 2b), is positioned in contact with the first surface 34. The heat dissipation unit 38 is mounted on the second surface 36 of the base 32. The heat dissipation unit 38 includes a plurality of heat dissipation fins 46. As seen in FIG. 3, the heat dissipation unit 38 comprises a plurality of rectangular dissipation fins 46. The fins 46 are mutually parallel and are collocated above the base 32. The heat dissipation unit 38 includes a predetermined number of heat dissipation fins 46 that have a portion removed to form an inclined area on the lateral side of the heat dissipation unit 38. The fan 40 is positioned on the inclined area and is mounted aslant to the lateral side of the heat dissipation unit 38. The inclined area of the heat dissipation unit 38 has an inclination that descends from an inner part to an outer part of the heat dissipation unit 38. Thus, the fan 40 is mounted above the inclined area of the heat dissipation unit 38 such that the fan 40 is inclining downward with the inclined area of the heat dissipation unit 38 supporting the fan 40. In this embodiment, the fan 40 is an axial fan where air enters in a vertical direction and leaves in a vertical direction. Hence, the axial fan 40 mounted aslant to the lateral side of the heat dissipation unit 38 sweeps the air into the heat dissipation unit 38.

As shown in FIG. 3, the air-conducting device 42 has a shape of inverted U. The air-conducting device 42 covers the upper, front and back sides of the heat dissipation unit 38. The fan positioner 48 is a fixed frame that extends from the upper surface of the air-conducting device 42 at an angle between the fan positioner 48 and the upper surface of the air-conducting device 42. The angle positions the fan 40 aslant to the lateral side of the heat dissipation unit 38.

The inclined angle between the fan 40 and the upper surface of the air-conducting device 42 is in a range from zero degree to ninety degrees, and the angle can correspond to the position of the fan 40. The fan 40 sweeps the air into the central area of the heat dissipation unit 38 so that the area of the greater air flow speed impinges directly on the central area of the heat dissipation unit 38. The effect of the increased impinging air flow greatly enhances the heat dissipation performance of the heat sink 30.

Since the fan 40 is mounted aslant to the lateral side of the heat dissipation unit 38, the air entering the fan is not so close to the housing that the air entry area is too small. Thus, the position of the fan 40 increases the quantity of the air flow and enhances the heat dissipation efficiency. Further, since the fan 40 is mounted aslant to the lateral side of the heat dissipation unit 38, the height of the heat dissipation unit 38 can be increased to enlarge the heat dissipation area of the heat dissipation unit 38. Furthermore, the design of the air-conducting device 42 directs the air flow generated by the fan 40 into the heat dissipation unit 38 so that the air flow is not scattered. Therefore, the structure of the present invention enhances the heat dissipation efficiency. In addition, the design of the heat sink 30 lowers the height of the heat sink 30 so that the space in the housing can be used more flexible.

The base 32 and the heat dissipation unit 38 are made of highly heat conductive materials, such as copper and alumina, etc., to provide the best effect of heat dissipation. In this embodiment, the base 32 and the heat dissipation unit 38 are made of copper, and the heat dissipation unit 38 is soldered on the base 32.

Further, the base 32 and the heat dissipation unit 38 can be made by any other process. For example, the heat dissipation unit 38 and the base 32 comprise an integral whole formed by aluminum extrusion. Alternatively, the heat dissipation unit 38 may comprise pieces of copper or alumina that are bent to form folded dissipation fins. The fins are then soldered or glued onto the base 32. As a further alternative, the base 32 and the heat dissipation unit 38 may be constructed by die casting.

Figure 4:
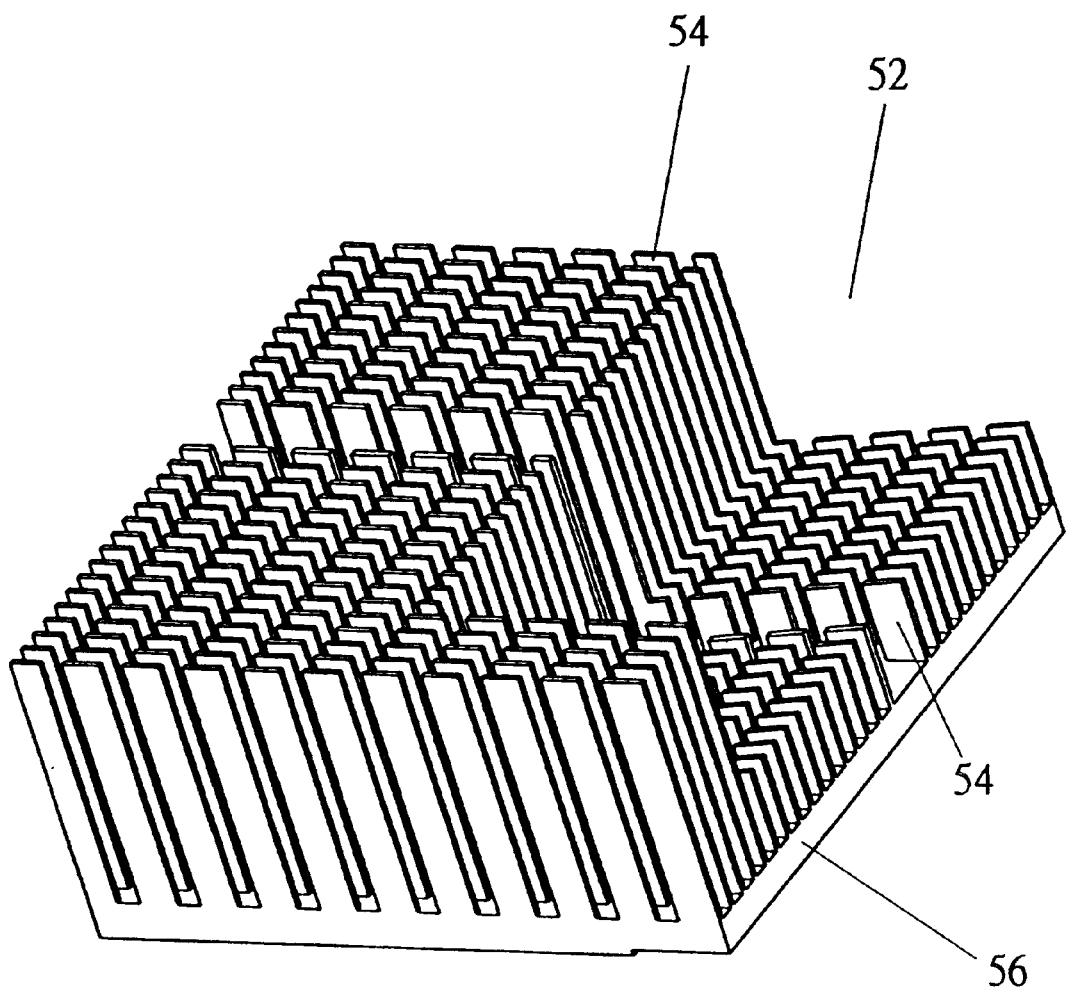
FIG. 4 is a schematic diagram of another embodiment of the heat dissipation unit in the heat sink in accordance with this invention.

FIG. 4 is a schematic diagram of another embodiment of a heat dissipation unit 52 of the heat sink 30 according to this invention. The heat dissipation unit 52 differs from the heat dissipation unit 38 in FIG. 2 because the heat dissipation unit 52 comprises a plurality of longitudinal dissipating fins. As shown in FIG. 4, the cross sections of the longitudinal dissipating fins are rectangular; however, the cross sections may also be selected from the shapes of wingspan, falcate, and teardrop. In the present embodiment, the longitudinal dissipating fins 54 have two different heights to form an accommodating area on the side of the heat dissipation unit 52 to enable the fan 40 to be mounted aslant to the lateral side of the heat dissipation unit 52. As shown in FIG. 4, the base 56 and the heat dissipation unit 52 are formed as an integral whole by aluminum extrusion.

The longitudinal dissipating fins 54 may advantageously have a plurality of different heights. In particular, a predetermined number of the longitudinal dissipating fins 54 in the heat dissipation unit 52 have a common reduced cross section to form an inclined area on the side of the heat dissipation unit 52. The fan 40 can be mounted in the inclined area and positioned aslant to the lateral side of the heat dissipation unit 52.

Figure 7:
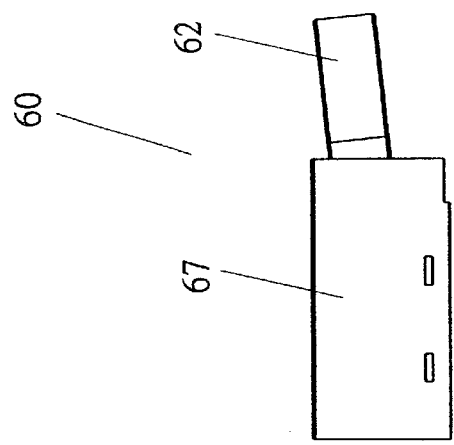
FIG. 7 is a side elevational diagram of the heat sink in FIG. 5.
Figure 6:
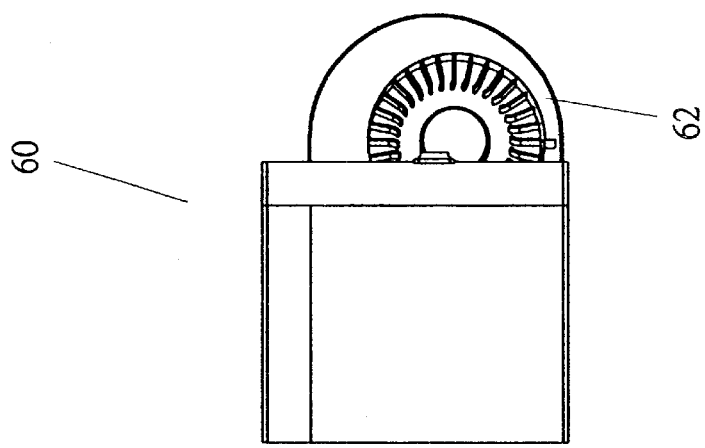
FIG. 6 is a bottom plan diagram of the heat sink in FIG. 5.
Figure 5:
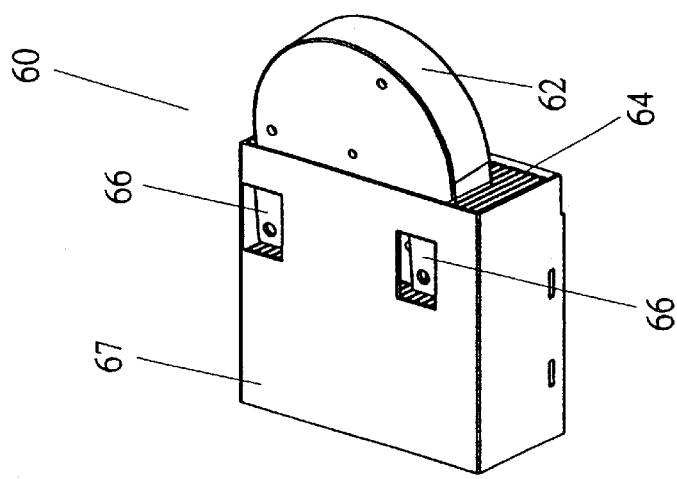
FIG. 5 is a schematic diagram of another embodiment in the heat sink in accordance with this invention.
Figure 8:
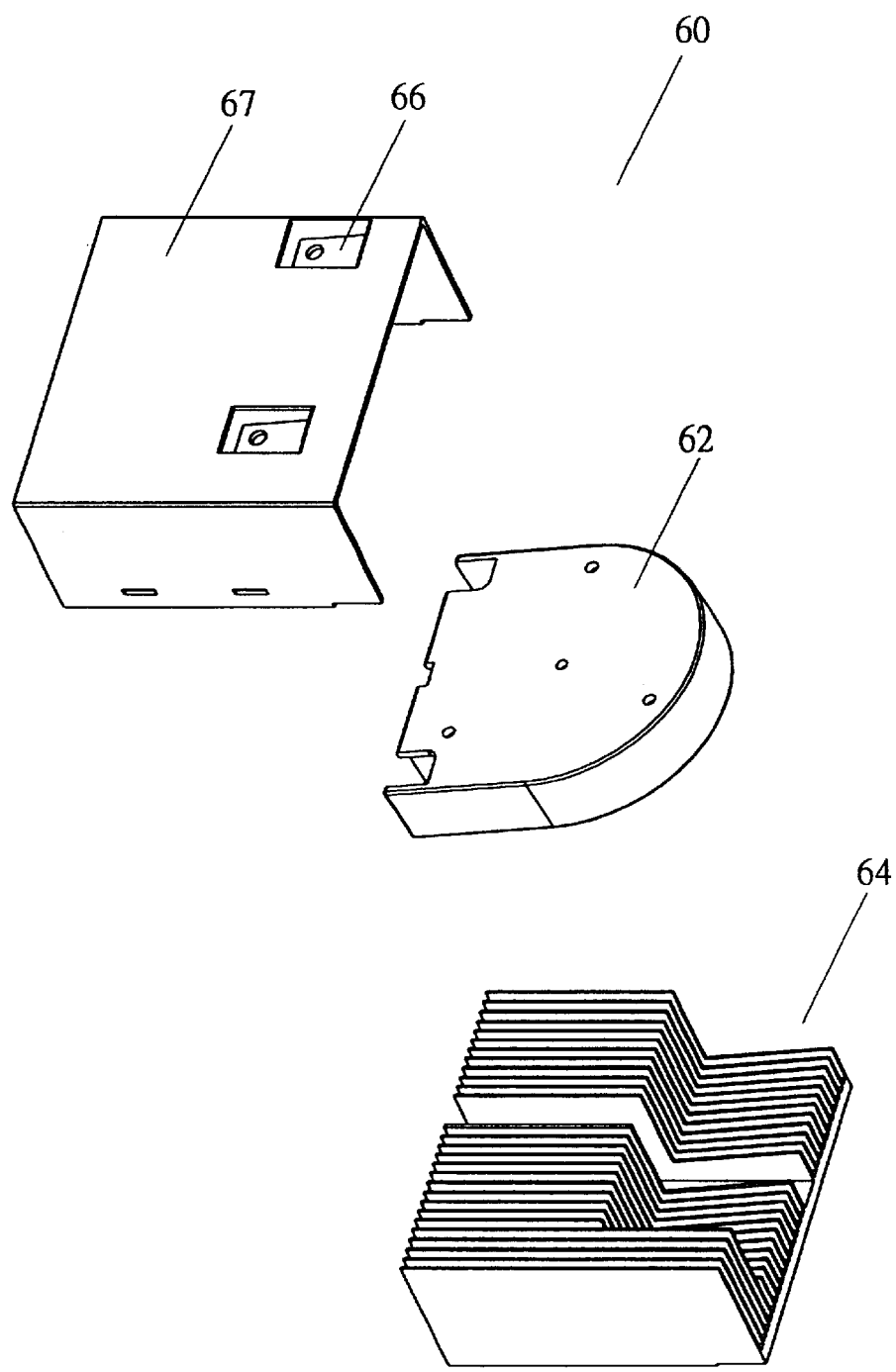
FIG. 8 is an exploded view of the elements of the heat sink in FIG. 5.

FIGS. 5–8 illustrated a further embodiment of the present invention. FIG. 5 is a schematic diagram of a heat sink 60 according to this embodiment. FIG. 6 is a bottom plan diagram of the heat sink 60 of FIG. 5. FIG. 7 is a side elevational diagram of the heat sink 60 of FIG. 5. FIG. 8 is an exploded view of the elements of the heat sink 60 of FIG. 5.

The heat sink 60 of FIGS. 5–8 differs from the heat sink 30 in FIG. 2 because a fan 62 mounted to the heat sink 60 is a blower. In particular, air enters the fan 62 in a vertical direction and leaves the fan 62 in a horizontal direction. Therefore, the different air flow direction of the blower 62 permits the design of a heat dissipation unit 64 and a fan positioner 66 in the heat sink 60 to be different from the corresponding elements in the heat sink 30. An inclining area of the heat dissipation unit 64 has an inclination that ascends from an inner part to an outer part of the unit 64. Thus, the fan 62 is mounted above the inclined area of the heat dissipation unit 64 so that the inclined area of the heat dissipation unit 64 supports the fan 62 such that an extended portion of the fan 62 is inclined upward. A fan positioner 66 extends from the upper surface of the air-conducting device 67 as two positioning arms to fix the fan 62 in a selected position. Preferably, the inclination of the inclined area of the heat dissipation unit 64 is selected to that the maximum height of the inclined fan 62 does not exceed the height of the heat dissipation unit 64.

In contrast to the prior art heat sink, the fans of the heat sinks according to the present invention are mounted aslant to the lateral sides of the respective heat sinks so that the heights of the heat sinks according to the present invention are lower than that of prior art heat sinks. These features increase the flexibility of space utilization. The air enters the fan of the heat sink from the side so there is a larger air entry area. This prevents the fan from running idle (i.e., without air flow) or from generating a quantity of air flow that is too small. Thus, the present invention enhances the heat dissipation efficiency. Since the fan of the heat sink according to this invention sweeps the air aslant into the central area of the heat dissipation unit, the impinging air flow proximate to the computer chip removes the heat generated by the computer chip effectively. Moreover, the design of the air-conducting device directs the air flow into the heat dissipation unit 38 and greatly enhances the heat dissipation effect.

While the invention has been described with reference to various illustrative embodiments, the description is not intended to be construed in a limiting sense. Various modifications of the illustrative embodiments, as well as other embodiments of the invention, will be apparent to those skilled in the art upon reference to this description. It is therefore contemplated that the appended claims will cover any such modifications or embodiments as may fall within the scope of the invention defined by the following claims and their equivalents.

What is claimed is:

1. A heat sink for a computer chip, comprising:
   a base having a first surface and a second surface, said computer chip being positioned in contact with said first surface;
   a heat dissipation unit mounted on said second surface of said base, said unit including a plurality of heat dissipation fins; and a fan mounted on a lateral side of said heat dissipation unit, part of said fan covering said heat dissipation unit.

2. The heat sink as claimed in claim 1, further including a air-conducting device having a shape of an inverted U, which covers said heat dissipation unit.

3. The heat sink as claimed in claim 1, further including a fan positioner for fixing the position of said fan.

4. The heat sink as claimed in claim 1, wherein said heat dissipation unit is mounted on said second surface of said base by soldering.

5. The heat sink as claimed in claim 1, wherein said heat dissipation unit and said base are an integral whole.

6. The heat sink as claimed in claim 1, wherein said heat dissipation unit and said base are made of highly heat conductive materials.

7. The heat sink as claimed in claim 1, wherein said computer chip is a Central Processing Unit (CPU) chip.

8. The heat sink as claimed in claim 1, wherein said heat dissipation unit comprises a plurality of rectangular dissipation fins, said rectangular dissipation fins being mutually parallel and collocated above said base.

9. The heat sink as claimed in claim 1, wherein said heat dissipation unit comprises a plurality of longitudinal pin dissipating fins.

10. The heat sink as claimed in claim 1, wherein said fan is mounted aslant to the lateral side of said heat dissipation unit with an inclined angle between said fan and a horizontal plane in a range from zero degree to ninety degrees, said angle corresponding to the position of said fan.

11. The heat sink as claimed in claim 1, wherein said fan is an axial fan.

12. The heat sink as claimed in claim 1, wherein said fan is a blower.

13. The heat sink as claimed in claim 8, wherein said heat dissipation unit includes a predetermined number of heat dissipation fins with corners removed to form an accommodating area on the side of said heat dissipation unit, and wherein said fan is mounted aslant to the lateral side of said heat dissipation unit.

14. The heat sink as claimed in claim 8, wherein said heat dissipation unit includes a predetermined number of heat dissipation fins having a common inclination to form an accommodating area on the side of said heat dissipation unit, and wherein said fan is mounted aslant to the lateral side of said heat dissipation unit.

15. The heat sink as claimed in claim 9, wherein said heat dissipation unit includes said longitudinal dissipating fins of different heights to form an accommodating area on the side of said heat dissipation unit, and wherein said fan is mounted aslant to the lateral side of said heat dissipation unit.

16. The heat sink as claimed in claim 9, wherein said heat dissipation unit includes said longitudinal dissipating fins having a common inclination cross section to form an accommodating area on the side of said heat dissipation unit, and wherein said fan is mounted aslant to the lateral side of said heat dissipation unit.

17. A heat sink for a computer chip, comprising:
a base having a first surface and a second surface, said computer chip being positioned in contact with said first surface;
a heat dissipation unit mounted on said base, said unit including a plurality of dissipating fins; and
a fan mounted on the lateral side of said heat dissipation unit, part of said fan covering said heat dissipation unit, wherein:
said heat dissipation unit comprises a plurality of rectangular dissipation fins;
said rectangular dissipation fins are mutually parallel and are collocated above said base;
said heat dissipation unit includes a predetermined number of heat dissipation fins having a common inclination to form an accommodating area on the side of said heat dissipation unit; and
said fan is mounted aslant to the lateral side of said heat dissipation unit.

18. A heat sink for a computer chip, comprising:
a base having a first surface and a second surface, said computer chip being positioned in contact with said first surface;
a heat dissipation unit mounted on said base, said unit including a plurality of dissipating fins; and
a fan mounted on the lateral side of said heat dissipation unit, part of said fan covering said heat dissipation unit, wherein:
said heat dissipation unit comprises a plurality of longitudinal pin dissipating fins;
said heat dissipation unit includes said longitudinal pin dissipating fins having a common inclination cross section to form an accommodating area on the side of said heat dissipation unit; and
said fan is mounted aslant to the lateral side of said heat dissipation unit.

19. A heat sink for a computer chip, comprising:
a base having a first surface and a second surface, said computer chip being positioned in contact with said first surface;
a heat dissipation unit mounted on said second surface of said base, said unit including a plurality of heat dissipation fins;
a fan mounted on a lateral side of said heat dissipation unit; and
a fan positioner for fixing the position of said fan.

20. A heat sink for a computer chip, comprising:
a base having a first surface and a second surface, said computer chip being positioned in contact with said first surface;
a heat dissipation unit mounted on said second surface of said base, said unit including a plurality of longitudinal heat dissipating fins of different heights to form an accommodating area on the side of said heat dissipation unit; and
a fan mounted on a lateral side of said heat dissipation unit aslant to said lateral side of said heat dissipation unit.

* * * * *